US008604828B1

(12) United States Patent (10) Patent No.: US 8,604,828 B1
Bickford et al. (45) Date of Patent: Dec. 10, 2013

(54) VARIABLE VOLTAGE CMOS OFF-CHIP DRIVER AND RECEIVER CIRCUITS

(75) Inventors: Harry Randall Bickford, Ossining, NY (US); Paul William Coteus, Yorktown Heights, NY (US); Robert Heath Dennard, New Rochelle, NY (US); Daniel Mark Dreps, Georgetown, TX (US); Gerard Vincent Kopcsay, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/657,849

(22) Filed: May 31, 1996

(51) Int. Cl.
*H03K 19/0175* (2006.01)
(52) U.S. Cl.
USPC .................. 326/81; 326/86; 326/68; 326/63
(58) Field of Classification Search
USPC .............. 326/86, 90, 30, 63, 68, 83; 327/333
See application file for complete search history.

(56) References Cited

U.S. PATENT DOCUMENTS

| 4,853,560 | A | | 8/1989 | Iwamura et al. | |
|---|---|---|---|---|---|
| 5,095,231 | A | * | 3/1992 | Sartori et al. | 326/30 |
| 5,162,672 | A | | 11/1992 | McMahan et al. | |
| 5,311,083 | A | * | 5/1994 | Wanlass | 326/68 |
| 5,467,455 | A | * | 11/1995 | Gay et al. | 710/100 |
| 5,535,241 | A | * | 7/1996 | Mahant-Shetti et al. | 375/219 |
| 5,576,642 | A | * | 11/1996 | Nguyen et al. | 326/86 |
| 6,060,905 | A | * | 5/2000 | Bickford et al. | 326/81 |

FOREIGN PATENT DOCUMENTS

| EP | 0315473 | | 5/1989 |
|---|---|---|---|
| EP | 0410402 | A2 | 1/1991 |
| EP | 0463316 | A1 | 1/1992 |
| WO | 93/00746 | | 1/1993 |

OTHER PUBLICATIONS

IEEE Journal of Solid-State Circuits, vol. 23, No. 2, Apr. 1988, New York, pp. 457-464, XP002031275, Krymm et al., "A Self-Terminating Low-Voltage Swing CMOS OutPut Driver".

* cited by examiner

*Primary Examiner* — Vibol Tan
(74) *Attorney, Agent, or Firm* — Daniel P Morris

(57) ABSTRACT

A structure is described having a plurality of electronic devices with the same or different internal CMOS voltages; an interconnection between two or more of the electronic devices; driver and receiver circuits which provide selectable input/output voltage levels for interfacing with several generations of CMOS technology, thus allowing chips fabricated in such technologies to communicate using a signal voltage range most suitable for each chip; Circuitry for selecting or adjusting the type of receiver circuit used, thus allowing either the use of a differential comparator circuit with an externally supplied reference voltage, or alternatively, the use of an inverter style receiver with an adjustable threshold, the selection being accomplished by setting the external reference to a predetermined voltage; Circuitry for selecting or adjusting the switching threshold of the inverter receiver circuit, which enables the threshold to be set appropriately for a given input signal voltage range.

3 Claims, 15 Drawing Sheets

VARIABLE VOLTAGE COMMUNICATION $Vdd1 \leq Vdd2 \leq Vdd3$     (INTERNAL VOLTAGE)

$VddQ \leq Vdd1$     (EXTERNAL VOLTAGE)

VM1, VM2, VREF CONTROL OFF-CHIP RECEIVERS

VM1, VM2 CAN BE EXTERNALLY OR INTERNALLY CONTROLLED

VREF IS EXTERNALLY CONTROLLED

VARIABLE VOLTAGE CMOS OFF-CHIP DRIVER AND RECEIVER CIRCUITS

TECHNICAL FIELD

The present invention is directed to variable voltage CMOS off-chip driver and receiver circuits and uses thereof in data processing systems.

BACKGROUND

The present invention relates to data processing systems, and more particularly to an improved method and apparatus for the communication between electronic devices to improve system cycle time, cost, and reliability. Modern high speed electronic systems often have chips of different internal voltage communicating with each other on a common bus. For example, because of intense competition in the microprocessor marketplace, there is great incentive for manufacturers to use the latest CMOS technology for the processor chip in order to achieve the highest possible clock frequency. However, the chips which provide memory and cache controller functions are often fabricated in the most cost effective technology, which is usually a generation or two behind the processor fabrication technology. In accordance with well established CMOS scaling principles, the supply voltage, Vdd, is being reduced as the chip minimum lithography dimension is made smaller. Thus, 5V technologies have been mostly supplanted by faster 3.3V CMOS chips with a 0.35-0.5 micron minimum dimension. The next generation of CMOS (0.2-0.25 micron) will use a Vdd of 2.5V, with future scaling of supply voltage to below 2V for subsequent generations of technology. Since it is best if all chips send and receive signals of the same voltage, this creates a problem. The common practice is to make all chips communicate at a 'high' voltage. For modern CMOS signals that would be either 3.3 or 5.0V. This creates several problems for chips with lower internal voltage.

One problem is increased delay and chip area due to the need for voltage translation circuits. Another problem is that even with translation circuits, the thin oxide layers of the transistors are stressed by the high external voltage, and are operating very close to the failure limit.

A similar problem that occurs is compatibility between chips of different internal voltages but the same or similar function. For example, it is now common practice in the computer industry to 'remap' a chip into a lower voltage, faster silicon technology. Thus a processor chip with a 3.3V internal voltage and a 0.4 micron gate length might be made with a more advanced silicon technology with a 2.5V internal voltage and a 0.25 micron gate length, with a resultant increase in operating frequency and a decrease in chip power. The problem is that the first processor can communicate easily with 3.3V SRAMs used for an external level 2 cache, but the 2.5V processor may have communication problems and voltage translation circuits may have to be used. Similarly SRAM's are 'mapped' into lower voltage. It is a likely scenario for both a processor and an SRAM to have 2.5V or even 1.8V internal voltage and be communicating with 3.3V external CMOS signals, with subsequent increased circuit cost, power, and delay. The higher external voltage can also cause decreased circuit reliability.

An alternative proposal is to have all chips communicate at a voltage lower than any internal voltage. An example is the 1.2V HSTL (High Speed Transceiver Logic) standard now before the Solid State Products Engineering Council (JEDEC) division of Electronic Industries Association (EIA). This method requires complex packaging for simple systems where all chips have the same voltage. Moreover the small signal swings of this low voltage interface can be too small for chips of high power, i.e., a 2.5V processor chip and a 1.2V interface, with coupled noise between the internal circuits and the interface circuits causing false data to appear on system busses. Nevertheless, there are times when such an interface is desired. It would be very helpful to have a means to switch between such a very low voltage interface, which requires a differential comparator type receiver and an externally supplied voltage reference VREF, and a standard CMOS interface which is best handled with a CMOS inverter as a receiver.

A previous invention by the authors, "VARIABLE VOLTAGE, VARIABLE IMPEDANCE CMOS OFF-CHIP DRIVER AND RECEIVER INTERFACE AND CIRCUITS", filed as Ser. No. 08/598,084 in the United States, describes a variable voltage driver and receiver circuit, designed in CMOS, which can be used to send or receive CMOS signals (i.e., signals which swing between ground and the I/O voltage, VddQ) at various voltages, as long as VddQ<Vdd, the internal supply voltage. To accomplish this digital signals were used to vary properties of the driving and receiving circuit. Our new invention, described below, improves on this design by removing the requirement of digital controls for the driving circuit. Also, Ser. No. 08/598,084 could receive signals only through a CMOS inverter, i.e., it could not utilize the external reference voltage VREF described in recently approved JEDEC standards such as HSTL, GTL, CTT, and SSTL. Our new invention, described below, receives both CMOS signals through a CMOS inverter, or through a comparator circuit utilizing the VREF signal. This and more will be described below.

SUMMARY OF THE INVENTION

The present invention provides an arrangement between a plurality of electronic devices of the same or different internal voltages, which communicate between themselves. The design is particularly useful for electronic systems based on CMOS circuits. For the purposes of describing the invention we will refer to off-chip CMOS drivers and receivers (OCD's or OCR's) designed to either send or receive voltage pulses of approximately 0 Volts with respect to ground, or some positive voltage, at a high frequency. We will make use of pFET (positive field effect transistor) and nFET (negative field effect transistor) devices, and resistors. The internal voltage (Vdd) of the on-chip chip circuits will be 3.3 Volts, and the external or communication voltage (VddQ) will be 3.3V or lower. Alternatively, Vdd will be 2.5V and VddQ will be 2.5V or lower. The minimum VddQ that is required today is 1.1V, to supply so called GTL levels.

Thus the OCD is based on traditional large pFET pullup devices (pFET with drain on the chip output and source on the off-chip voltage rail or VddQ) and large nFET pulldown devices (nFET with its drain on the chip output and its source at ground). In additon we add an nFET pullup device, which aids in operation when VddQ is much smaller than Vdd. The gates or inputs to the large pFETs are 3 way NAND (inverting three input logical 'and' circuits), designed to drive slowly to ground but quickly to VddQ. Of course, if just two independent control signals were required to switch the drivers, say data and data-enable, then 2 way NANDs could be used. The gates or inputs to the large nFETs are 3 way (or 2 way) NOR (inverting three input logical 'or' circuits), designed to drive slowly to Vdd (note, not VddQ) but quickly to ground. With such a design there is essentially no time when both the nFET and pFET output devices are both conducting, thus minimizing the current from Vdd to ground through the devices. The output of the nFETs has a small series resistor, before contacting the electrostatic discharge diode structure (ESD). The series resistor serves both to tailor the driver output impedance to the load circuit, and to reduce the voltage induced on the nFET device during a 'spark', or ESD event. The turn-on of the large pullup devices (both a pFET and an nFET) is controlled by the use of a resistor between the stacked gate drive devices and the gate inputs. The ratio of the pFET and nFET devices is carefully selected so that the output impedance is nearly independent of VddQ, hence no external controls are required. After fixing this ratio the sizes of all transistors are adjusted for the desired output impedance, which is in general the same for the pullup and pulldown devices.

Both the large pFET and nFET devices are arranged as 2 parallel devices. One of the two parallel devices is used when a high impedance output driver is desired, for example when driving a lightly loaded net with perhaps just two chips communicating. Both parallel devices are driven when a stronger, lower impedance driver is required, for example when driving a highly loaded bus with multiple chips on it. As described in our previous invention Ser. No. 08/598,084, the configuration line (or lines) to change driver impedance may be brought external to the chip and used to control the impedance of drivers on a common bus, as new units are inserted on the bus.

The OCR is a hybrid of two traditional designs, with a twist. The OCR can act as a differential comparator, switching quickly between low and high voltage as the sampled input signal swings from just below to just above an externally supplied reference voltage VREF. This comparator circuit is non-inverting, i.e., it's output is the same polarity as it's input. Because it is non-inverting we call it stage 0. The next, or first stage of this comparator OCR is a CMOS inverter. Thus it is a small pFET pullup with source connected to Vdd, and a small nFET pulldown device with source connected to ground. The threshold, or switch point of the inverter is determined by the relative size of each device. This inverter can also act as the input, or first stage of the OCR, when it is configured to operate in CMOS mode. To access this mode, the VREF signal is set equal to Vdd (A mirror circuit can be built where this mode is entered by setting VREF to ground.) When VREF=Vdd, a small pass-gate circuit is energized which allows the input to go around the first stage differential comparator (which has been shut off), and enter directly to the first inverter stage. The threshold of this inverter can be adjusted by changing the size of the p or n channel FETs. The method of changing the threshold is described in our previous invention Ser. No. 08/598,084. To adjust the threshold, each device is comprised of 2 parallel devices. One of the parallel device is always present, the other is switched in or out depending on the value of VddQ. There are 4 inverter stages (1-4) to the receiver in CMOS mode, and 5 stages (0-4) when it is in comparator mode. The final stage inverter drives into the chip logic. Internal stage number 3 is used to perform a multiplex (mux) function with a test data input, so that data from either the chip input, or data from an internal register, can be used to drive the internal chip logic.

The devices are used as follows. In our preferred embodiment chips of the same or different internal voltages are connected together on a common bus. The lowest possible internal voltage is 1.8V and the highest possible internal voltage is 3.3V. Clearly this technique is not restricted to these choices, we chose these values as representative of high speed electrical systems being designed today. We imagine that OCR's and OCD's of this style, i.e., variable voltage from the internal power rail voltage down to a small voltage, 1.1V in our preferred embodiment, are used on any device CMOS chip.

Not all chips need have the variable voltage function, although the more chips that do the greater the flexibility. For example, if one chip has Vdd=3.3V and one chip has Vdd=1.8, then the chip with Vdd=1.8V need only have a single voltage VddQ interface at 1.8V.

The OCR and OCD designs shown have been incorporated into a 3.3V, 0.36 micron minimum gate dimension CMOS processor design for use in data processing equipment.

It is therefore an object of the present invention to provide an arrangement of a plurality of electronic devices sharing a bus, or a common set of communication lines, that can allow for a change in the internal voltage of any of the devices, such as results when one changes to a lower voltage device technology.

It is yet another object of the present invention to have this flexibility with a reduced set of support devices such as power supplies or termination resistors.

It is yet another object of the invention to retain the traditional communication level, i.e., CMOS signaling, when all internal voltages of the chips communicating on the bus are the same.

It is yet another object of the invention to accommodate for changing the communication voltage on the bus in an automatic fashion.

It is yet another object of the invention to have this flexibility in communication voltage without significant added signal delay or control complexity.

It is yet another object of the invention to have this flexibility in communication voltage with improved system reliability.

It is yet another object of the invention to have this flexibility in communication voltage with improved system cost.

It is yet another object of the invention to have this flexibility with no changes required other than to provide the new voltage.

It is yet another object of the invention to make the communication voltage be equal to or less than the internal voltage of all devices on the bus.

It is yet another object of the invention to provide improved signal quality in the system.

These, and other, objects and advantages of the present invention will now be described, with reference to the following drawings, in which:

Table I summarizes a number of JEDEC standard low voltage interfaces.

Figure 11:
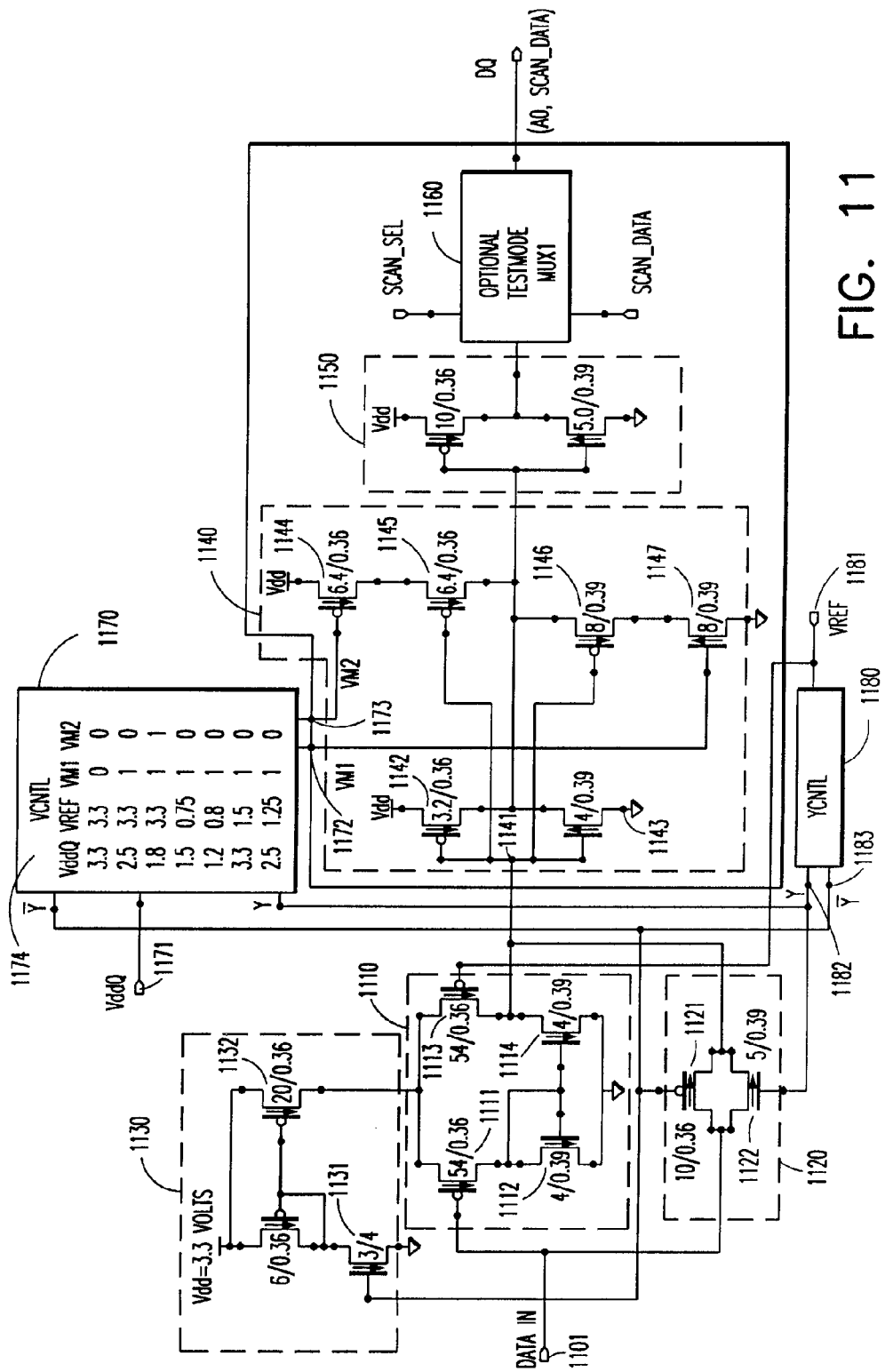
FIG. 11 shows the detailed schematic of a CMOS receiver that can accept input signals of either 1.8V, 2.5V, or 3.3V LVCMOS levels, or signal voltage levels corresponding to JEDEC interface standards for HSTL, GTL, SSTL-3 or SSTL-2.5.

Table II includes simulation results for the receiver of FIG. 11.

DETAILED DESCRIPTION OF THE PREFERRED EMBODIMENT

Figure 1:
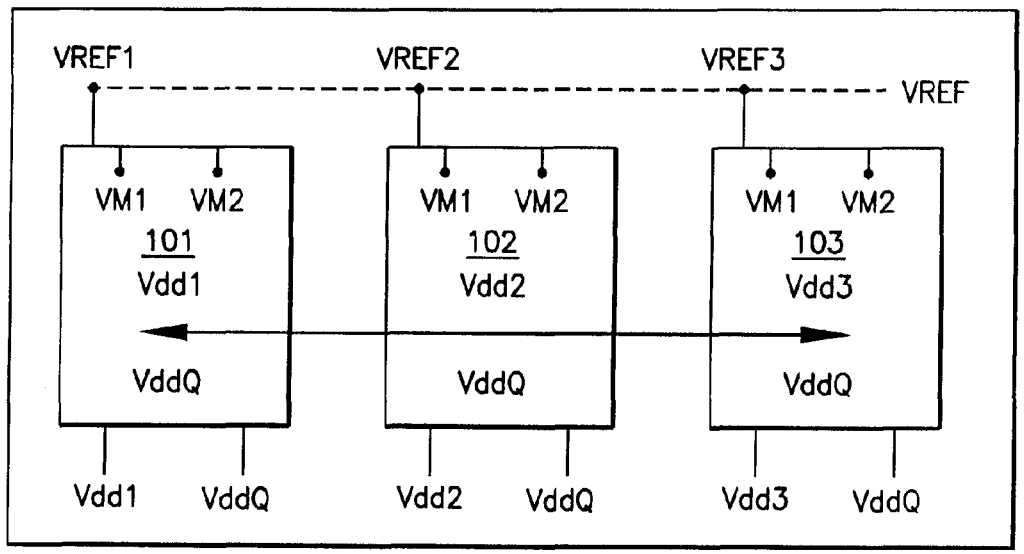
FIG. 1 shows a high level schematic of a high speed electronic system with 3 electronic devices of same or different internal voltages, communicating with a common voltage equal to the lowest internal voltage on the bus.

The driver and receiver circuits described below are preferred for use in the situation described by FIG. 1. Here 3 chips, 101, 102, and 103, run with internal voltages Vdd1, Vdd2, and Vdd3 respectfully. We will be describing the invention in terms of CMOS chips and CMOS off-chip drivers and receivers, but the design principles are valid for other systems and technologies as well. All chips send and receive data at a second, external voltage, VddQ. Thus signals which are common to all chips are communicated at a common external voltage VddQ, as shown. This voltage is variable in the sense that the external voltage or communication voltage VddQ is equal to or lower than the minimum of the internal voltages of all chips on a common bus.

Figure 12:
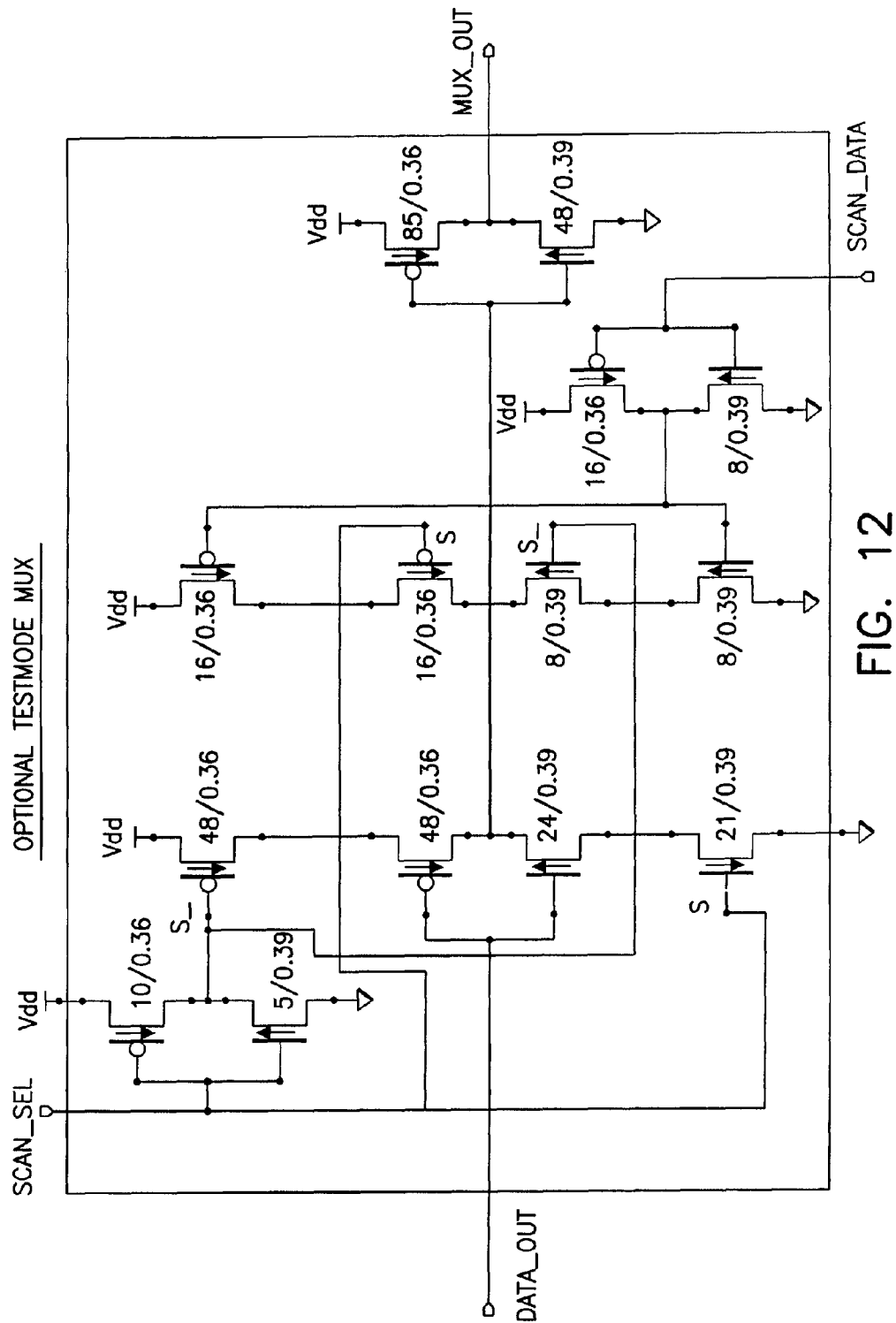
FIG. 12 shows details of a simple 2 input mux shown in the receiver of FIG. 11. The mux selects inputs either from the output of the 2 stage receiver, or test data from elsewhere on the chip.

No chip is required to drive or receive a voltage larger than its internal voltage. This removes most of the overhead of voltage translation circuits in terms of chip area and delay, and removes over-voltage reliability concerns. Moreover the lowest voltage chip can drive and receive voltages at its internal voltage, and has no voltage translation circuits and only one set of internal and external power rails. Since in general the lowest voltage chip is also the highest power, fastest, and most expensive chip (the processor chip if this is a modern computer system), the chip which wants to have the least complexity, highest reliability, and fastest speed is allowed to do so. The communication voltage can be set by externally by digital levels through signal pins, or it can be controlled through a programmable interface, or, if desired, it can be generated internally on the chip by sampling the voltage of the external power rails. In FIG. 1 the control signals VM1 and VM2 are shown as internal signals of each chip 101,102, and 103, and could be derived, in the case of Vdd=3.3V, using the circuit of FIG. 11. These same signals will be shown in the receiver design of FIG. 12.

Figure 2:
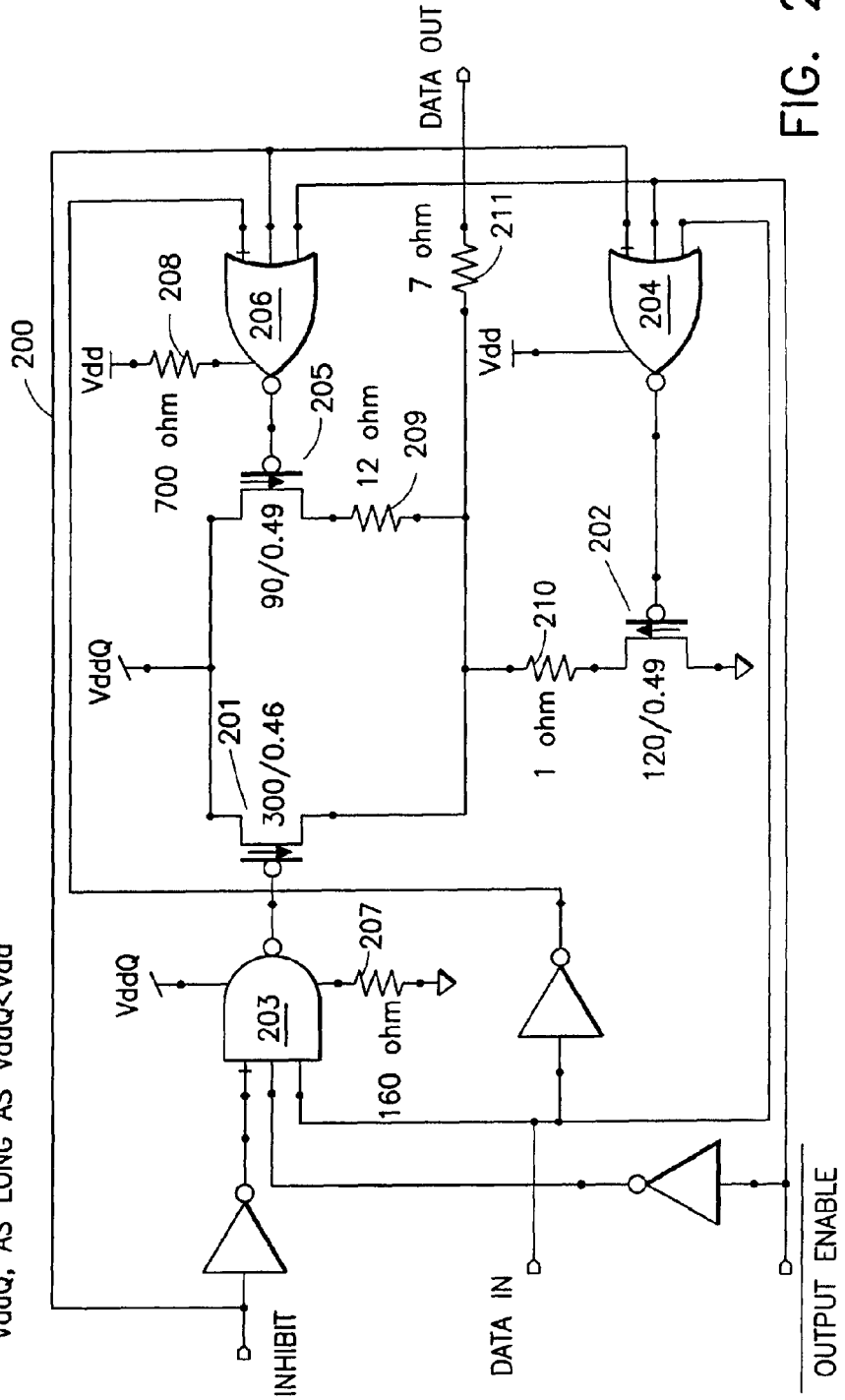
FIG. 2 shows a high level schematic of a variable voltage driver with a nominal impedance of 42 ohms including final metal wiring between the driver and the bonding pad, and the impedance properties as a function of VddQ for the circuit under nominal conditions of junction temperature (Tj), CMOS process conditions, and internal chip voltage Vdd.
Figure 2A:
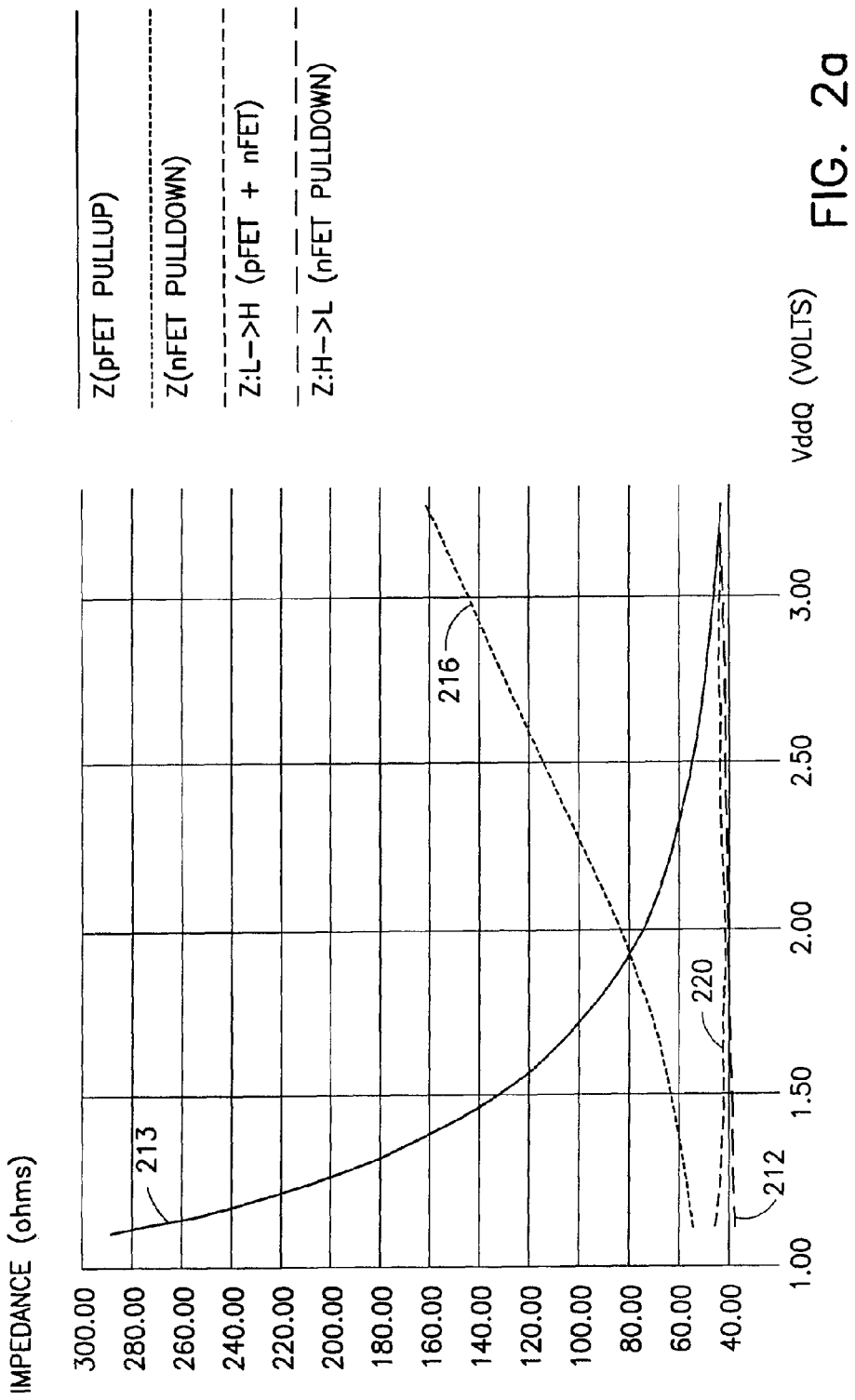
Figure 7:
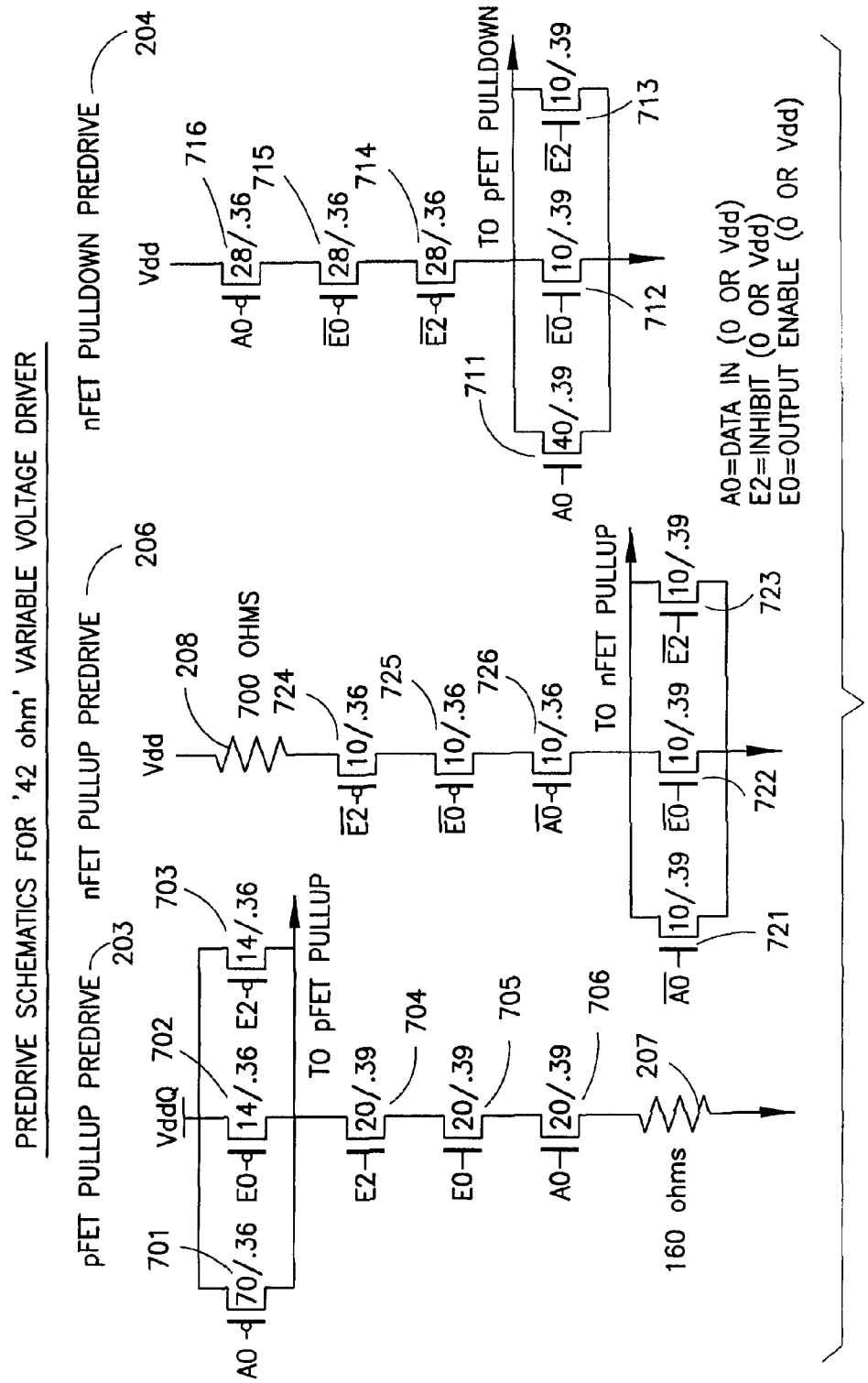
FIG. 7 shows the device level schematic for the 3 input NAND and 3 input NOR predrive logic of FIG. 2.

The driver 200 consists of logic and pre-drive circuits connected to output devices as shown in the schematic of FIG. 2. FIG. 7 shows more detail. It is important to note that the driver circuits are the same for all values of VddQ, that is, the driver operates with an output voltage from 1.1V to 3.3V with almost no change in output impedance.

Figure 3:
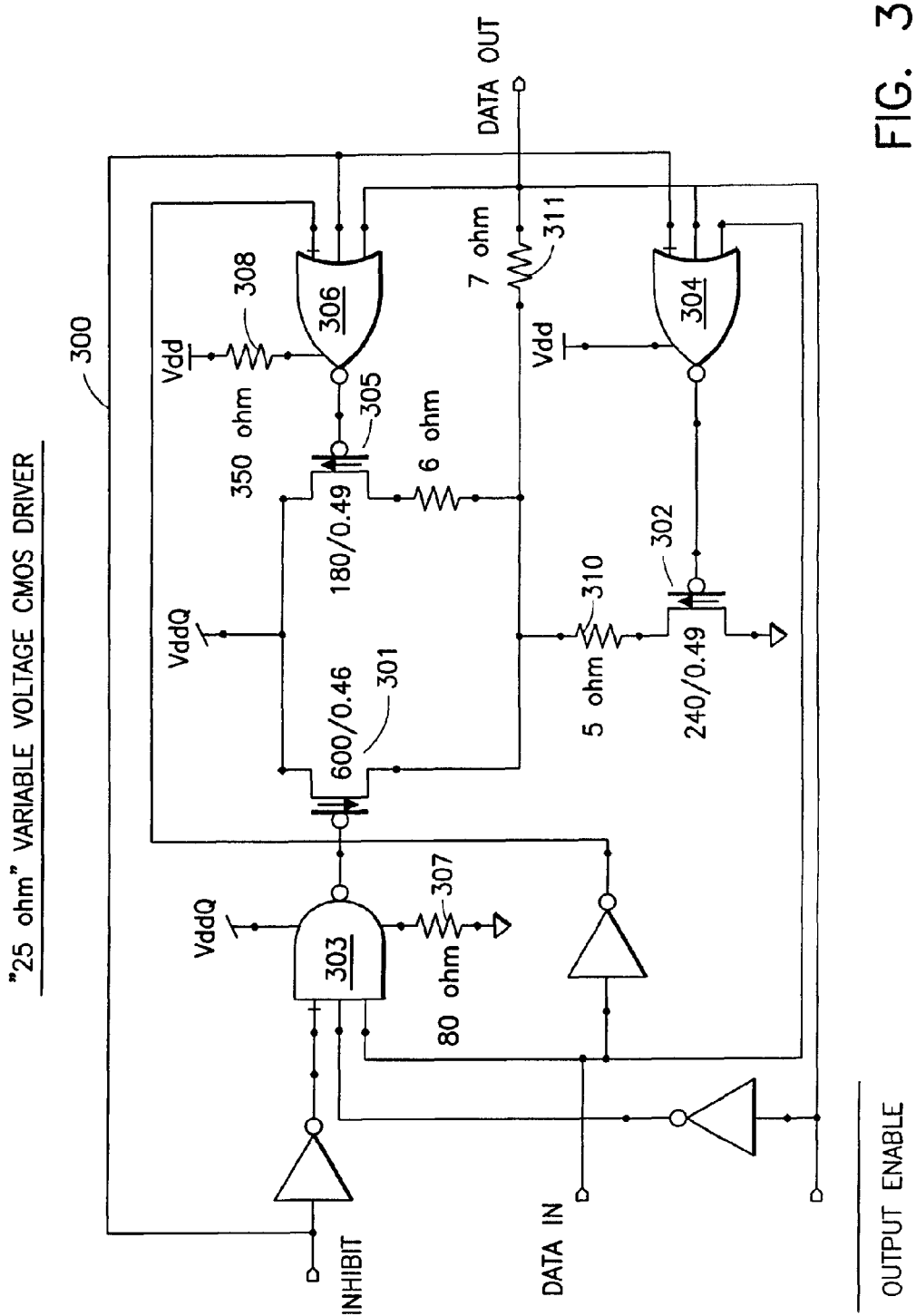
FIG. 3 shows a high level schematic of a variable voltage driver with a nominal impedance of 25 ohms, obtained by doubling the width (or halving the resistance) of the final state FETs and impedance matching resistors.

The value of the output impedance can be varied by changing the width of all output devices in FIG. 2, this is shown in FIG. 3.

The driver output stage of FIG. 2 consists of nFET and pFET devices connected in a normal CMOS configuration with the pFET (201) used as a pull-up, and the nFET (202) as a pull-down. Note that the gate of the pFET device is driven with a 3 way NAND (203) from ground to VddQ, or the I/O voltage, while the gate to the nFET pulldown device is driven with a 3-way NOR (204) from ground to Vdd, the internal chip voltage. In addition, a parallel nFET pull-up device (205), with gate driven with a 3-way NOR (206) from ground to Vdd, is used to cancel the variation in impedance with respect to VddQ of the pFET (201). Resistors 207 and 208 control the turn-on of the big pFET and nFET pullup devices respectively, while resistors 209 and 210 help to match the driver impedance to the impedance of a typical 50 ohm transmission line (not shown). The 7 ohm resistor 211 represents the resistance of wiring typically found connecting a chip I/O cell to a chip wiring pad. Resistors 209 and 210 also serve to reduce the voltage induced on the nFET transistors 206 and 202 during an electrostatic electrical discharge (spark) event.

The size of device 202 is chosen to give the desired impedance during a transition from a high to a low output voltage. For this circuit the nominal desired impedance is 42 ohms, and this value is obtained for VddQ from 1.1V to 3.3V as shown by curve 212 of FIG. 2. The impedance is constant to +/−3 ohms over this range. On the other hand the impedance of the pFET pullup 203 is varying from 42 to 290 ohms over this same voltage range, from transitions from the low to high output state, as seen by curve 213 of FIG. 2. In this case the pFET becomes less conductive at low VddQ. This tremendous change in output impedance is offset a similar variation in output impedance of the NFET pullup 206, but with an opposite trend, as seen in the curve 216 of FIG. 2. In this case the nFET is getting stronger, or more conductive, at low VddQ. If the two devices are selected with the proper ratio, the voltage dependence of the output impedance can be nearly cancelled, as shown by the impedance of the two devices 203 and 206 in parallel, or curve 220 of FIG. 2. Again the impedance is constant to +/−3 ohms. After the ratio of the two devices is fixed to remove most of the voltage dependence, the width of the devices can be changed by the same factor to match the impedance of the pulldown nFET 202, is series with the impedance matching resistor 210. Curve 26 and 220 include the effects of the impedance matching resistor 209 although the cancellation can be achieved without this resistor. The pairs of numbers associated with the FETs 203, 204, and 206 are the device width and length in microns for the 3.3V CMOS technology, 0.36 (0.039) micron minimum gate length for the pFET (nFET) of our preferred embodiment.

The impedance of driver 200 may lowered (raised) by proportionally increasing (decreasing) the widths of all devices, and proportionally decreasing (increasing) the values of all resistors preceding the final stage wiring resistor 211. FIG. 213 shows a driver 300 designed for 25 ohm nominal output impedance. All resistors 307, 308, 309, 310 have been halved from there counterpart 207, 208, 209, and 210 while all transistors 301, 302, 305 are twice the width of their counterpart 201, 202, and 205. Similar treatment of the devices inside of pre-drive stages 203, 204, and 206 is required to maintain constant driver turn-on/turn-off characteristics. The impedance of driver 300 driver of FIG. 3 is half the impedance of driver 200 of FIG. 2, once the effect of the unchanged 7 ohm resistor 311 (211) of driver 300 (200) is considered.

Figure 4:
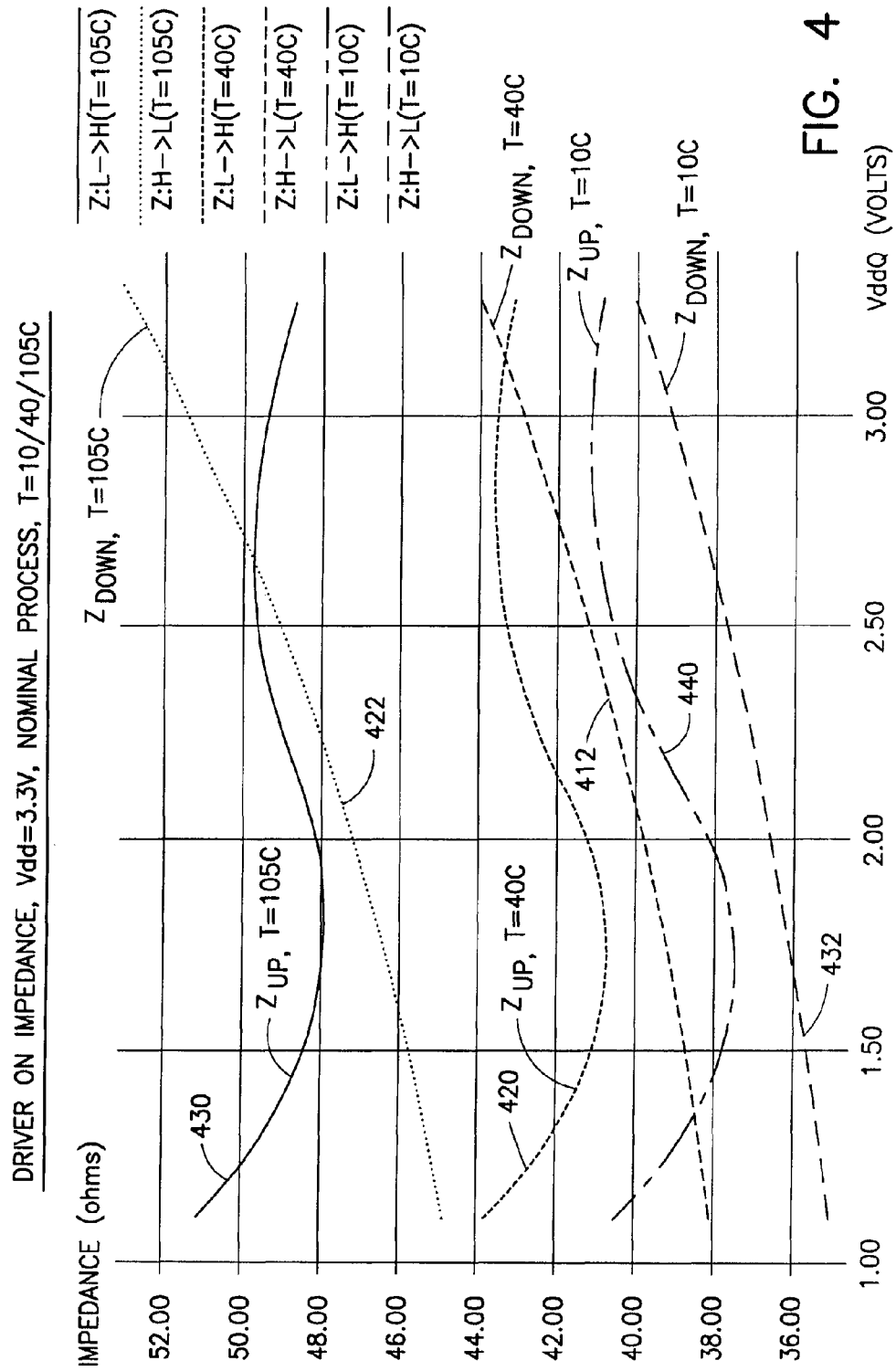
FIGS. 4, 5, and 6 shows the impedance properties of the driver of FIG. 2 as a function of VddQ, for changing conditions of Tj, CMOS process, and Vdd.

The curves 220 and 212, or the impedance of the driver of FIG. 2 while driving respectively and output high or an output low, is approximately constant as the I/O voltage is varied from 1.1V to 3.3V, or over the full range of low voltage standard specifications as defined by the JEDEC standards committee (Symmetric GTL, HSTL, LVCMOS, CTT, SSTL). The variation in output impedance is effected by temperature, voltage (Vdd), and CMOS process variation (variation in gate dimensions, oxide thickness, conductivity, etc). FIG. 4 shows the effects of varying the temperature of driver 200. Here curve 420 (412) is identical to curve 220 (212), showing the impedance of the pullup (pulldown) devices at nominal temperature, or T=40 C. Note that curve 420 has both positive and negative curvature in impedance verses VddQ, showing that both the linear and the quadratic variation of impedance with respect to VddQ has been cancelled by the use of both FETS 201 and 205 and the control circuits 203 and 206. Note also that curve 412 is nearly constant, but has both a linear and quadratic variation with respect to VddQ. Some of this variation may be removed by use of a pFET pulldown if desired. For driver 200, we felt the impedance variation with VddQ of device 202 was small enough that a pFET pulldown was not necessary.

Figure 5:
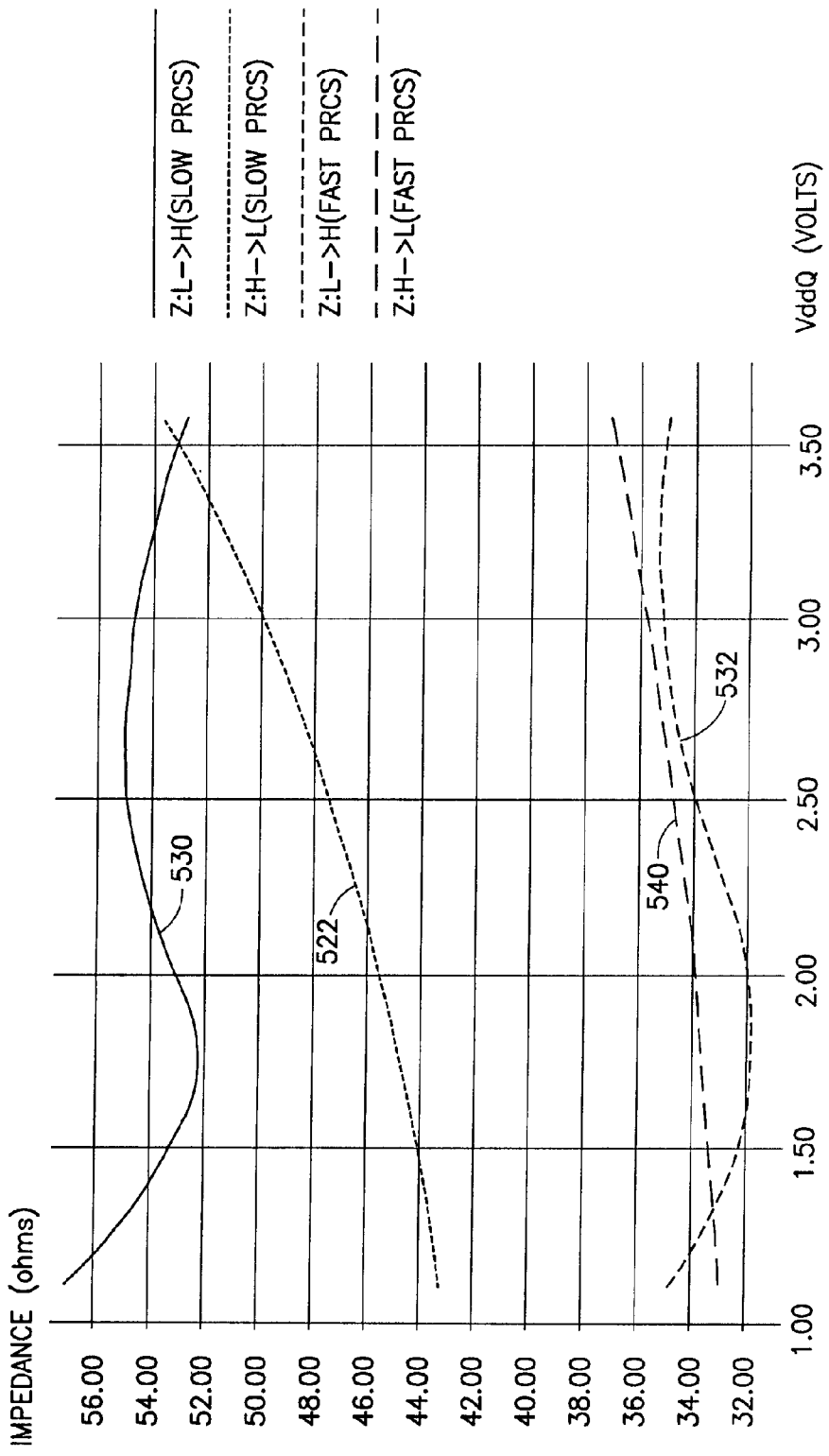

Curves 430 (440) show how the pullup impedance of driver 200 changes as temperature is changed to 105 C (10 C). The variation is typical of CMOS, and is larger than the variation in impedance with respect to VddQ. Similarly curve 422 (432) show how the pulldown impedance of 200 changes as temperature is changed to 105 C (10 C). Again the variation is as expected for CMOS, and larger than the variation in impedance with respect to VddQ. FIG. 5, curve 530 shows how curve 420 changes as CMOS process variables are changed from nominal to 3 standard deviation slow (gate dimensions increase, etc so as to slow down drivers). Similarly curve 540 shows how curve 420 changes as CMOS process variables are changed from nominal to 3 standard deviation fast (gate dimensions decrease, etc so as to speed up drivers). The variations are typical of CMOS and are larger than the variation in driver impedance with respect to VddQ. Curves 522 and 532 show how the pulldown impedance curve 412 changes with the same variation in process.

Figure 6:
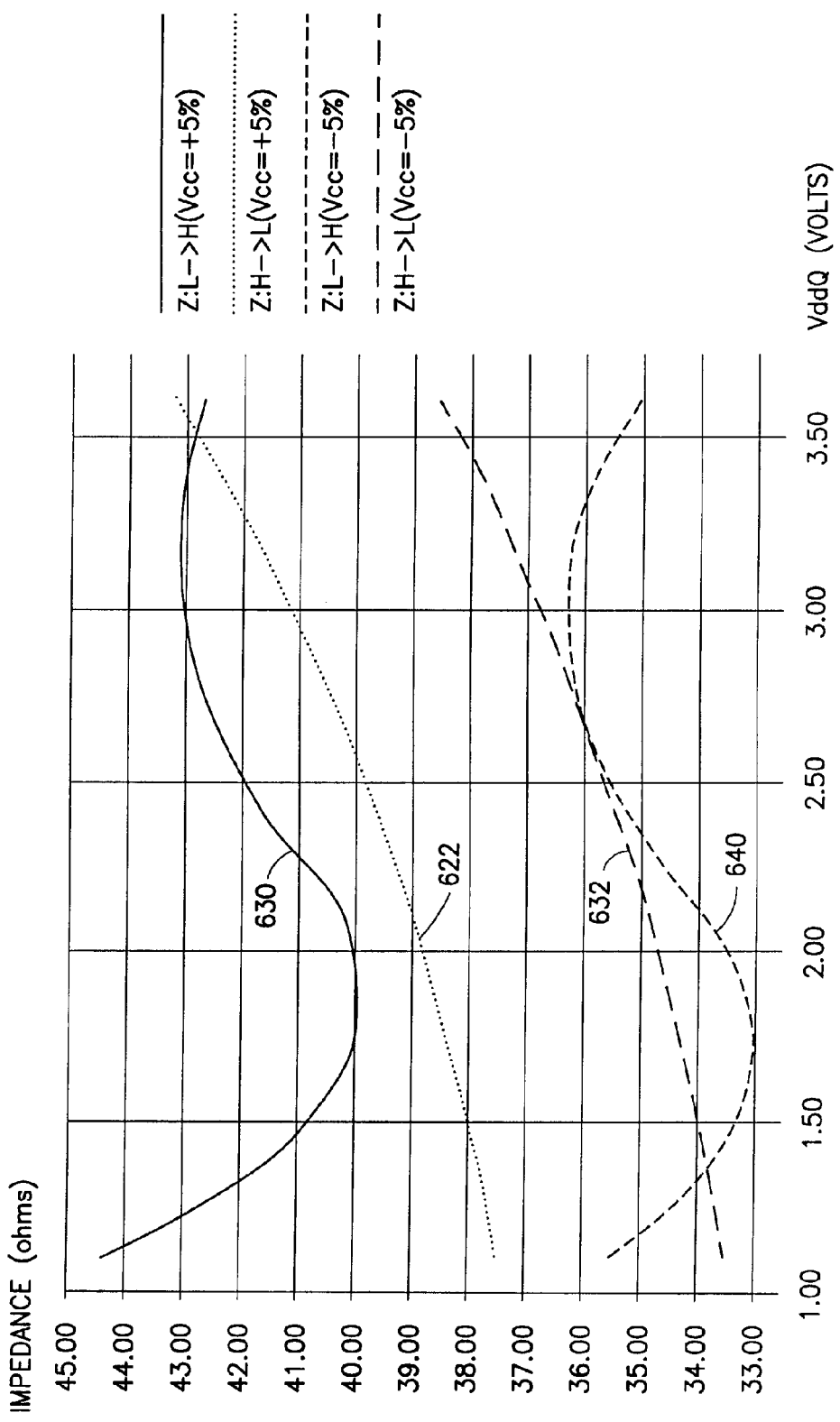

Similarly curves 630 and 640 of FIG. 6 shows how curve 420 changes as the internal voltage Vdd is varied by +5%,-5% respectfully. Again the change in driver pullup impedance with respect to expected variations in Vdd is larger than that observed as VddQ is varied from 1.1V to 3.3V. Curves 622 and 632 of FIG. 6 shows how curve 412 changes as the internal voltage Vdd is varied by +5%,-5% respectfully. Again the change in driver pulldown impedance with respect to expected variations in Vdd is larger than that observed as VddQ is varied from 1.1V to 3.3V.

The pre-drive circuits generate the required drive signals to the gate of each output pull-up or pull-down device. The pre-drive logic uses the control signals to select which output devices are to be driven for any given output voltage mode or impedance level. The pre-drive circuitry must be designed such that the nFET output devices be turned off quickly, before turning on the pFET output devices during a low to high transition. If both pull-up and pull down devices were turned on simultaneously, they would conduct shoot-through current from VddQ directly to ground which would dissipate excess power, and could pose reliability concerns. Conversely, during a high to low transition, the pre-drive circuitry must turn off the pFET output devices before turning on the nFET output devices to avoid shoot-through current. These undesirable conditions are avoided by proper design of the pre-drive logic as shown in FIGS. 5 and 6. Since the output nFET devices are all driven by NOR gates, these devices are turned off by devices in parallel (fast), and are turned on by devices in series (slow). For the output pFET devices, the pre-drive circuits are all NAND gates; these devices are thus also turned off by devices in parallel (fast), and are turned on by devices in series (slow). By choosing approximately equal device widths in the pull-up and pull-down paths of these NAND and NOR gates, the proper sequence constraints described above are satisfied, and shoot-through current is avoided. In addition, the size of the pre-drive transistors is chosen to minimize block delay without exceeding acceptable limits on switching current, di/dt.

By powering the pre-drive NAND gates 203 from VddQ as shown in FIG. 2, the proper sequence is maintained for turn-on, and turn off, of the output pFET 201 as VddQ is varied. The details of circuit 203, shown in FIG. 7. To avoid drawing excessive current through both devices 201 and 202 as device 202 is turned on (so called shoot-through current), it is necessary to quickly turn-off 201, before 202 is turned on. This is accomplished by making the devices for the logical signal that is causing the 202 to be turned on and 201 to be turned off, i.e., a0, (the data), to be large. Thus pFET device 701 is 70 microns wide by 0.36 microns long, substantially larger than the 14 micron wide pFETs 702 and 703, or any of that stacked nFET devices 704, 705, 706 used to turn-on 201. Resistor 207 is used to further delay the turn-on of pFET 201.

To avoid unnecessary delay in turning on the output nFETS 202 and 205, it is necessary to power the pre-drive NOR gates, 204 and 206 respectively, directly from Vdd. Again to avoid excessive shoot-through current it is necessary to quickly turn device 204 off. This is accomplished by making the devices for the logical signal that is causing the 201 to be turned on and 202 to be turned off, i.e., a0, (the data), to be large. Thus nFET device 711 is 40 microns wide by 0.39 microns long, substantially larger than the 10 micron wide nFETs 712 and 713, or any of that stacked devices 714, 715, 716 used to turn-on 202.

The pre-drive stage 206 for nFET pullup 205 is designed to quickly turn-off 205, and slowly turn it on. Quick turn-off is assured by parallel nFET devices 721, 722, and 723, each 10 microns wide by 0.39 microns long, while slow turn-on of 205 is realized by series pFET devices 724, 725, 726, in series with resistor 208.

Note that, in all cases described above, there is an inversion in the pre-drive stage, and a further inversion in the output stage, such that the driver is a non-inverting design.

Throughout this paper we refer to the results of numerical simulation of the circuits described. The simulations were done with models based on a 0.25 micron effective gate length (Leff) CMOS technology, and a nominal voltage of 3.3V. Because circuit delays, impedance, current, etc are functions of CMOS dimensions, circuit temperature, and operating voltage, these parameters were varied. For what follows we refer to nominal, worse case fast, and worse case slow conditions. Nominal conditions are: nominal CMOS feature size, temperature 40 C, nominal voltage. Worse case fast conditions are: CMOS feature size 3 standard deviations smaller than nominal, temperature 90 C, voltage +5% above nominal. Worse case slow conditions are: CMOS feature size 3 standard deviations larger than nominal, temperature 10 C, voltage −5% above nominal.

Figure 8:
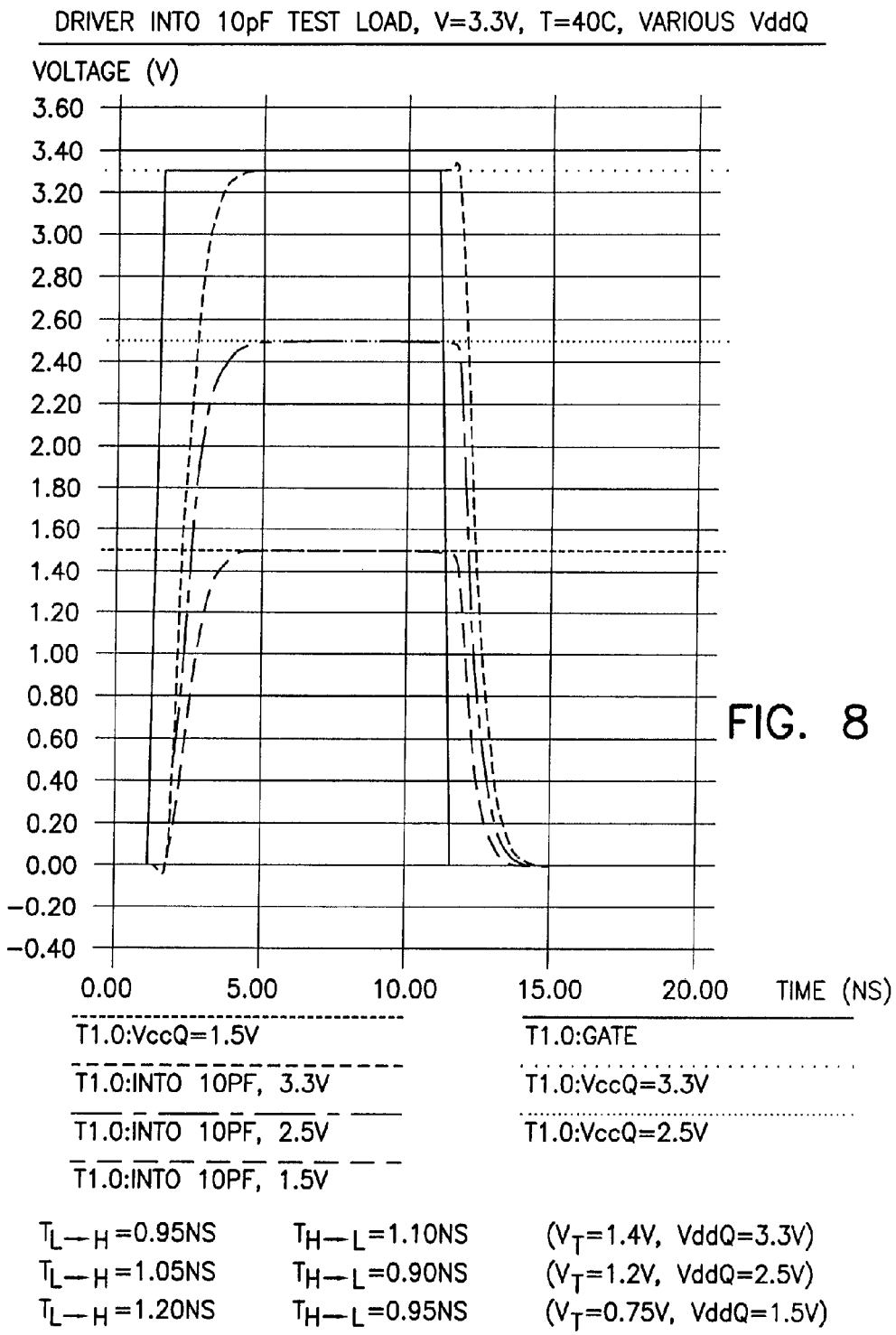
FIG. 8 shows a simulated voltage waveform of the driver of FIG. 2 charging and discharging a 10 pF capacitor at 100 MHz at the output of a chip for three different voltages, under worse case slow conditions. The time to drive from a low state to a high, or reverse, is essentially independent of the voltage.
Figure 9:
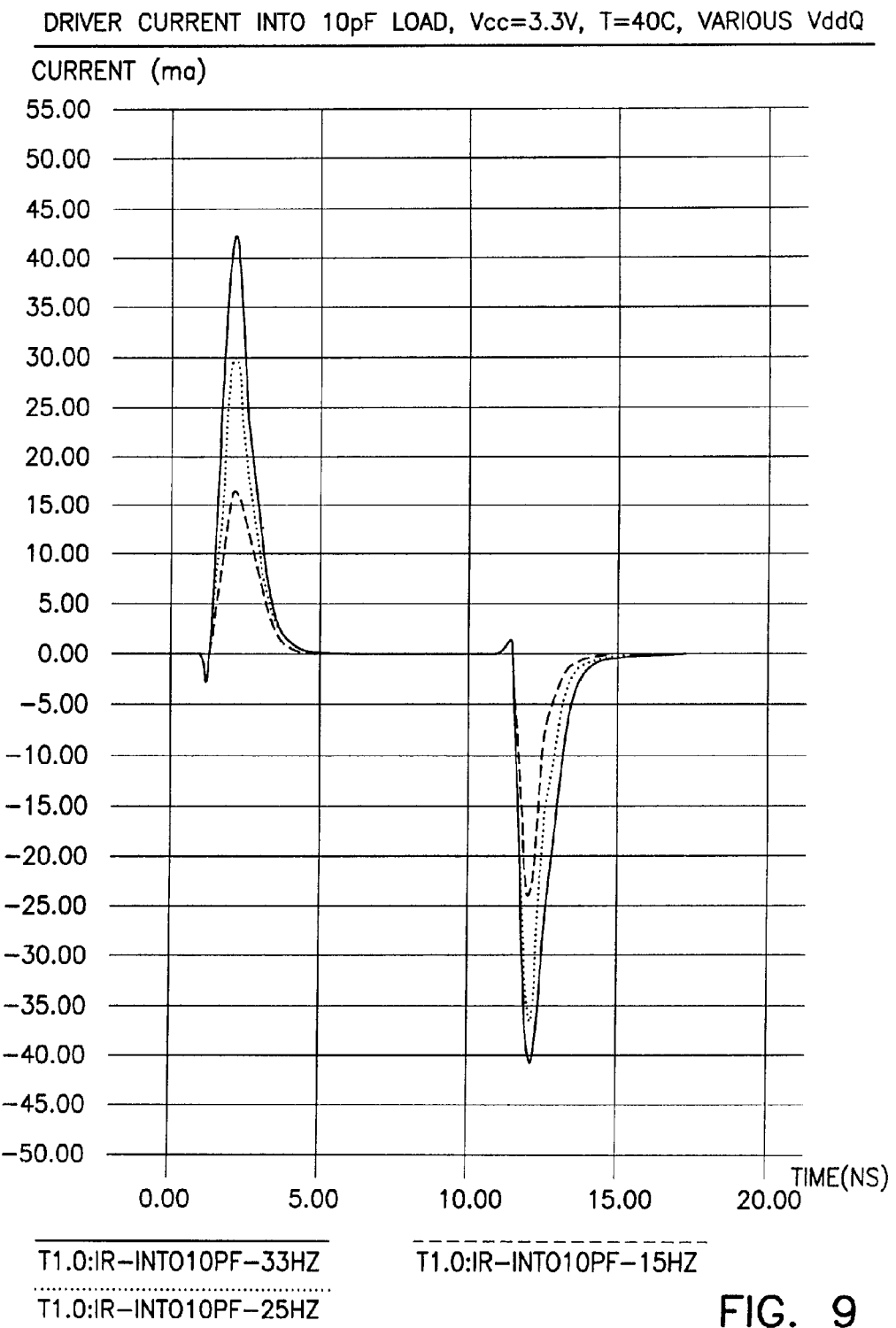
FIG. 9 shows a simulated current waveform of the driver of FIG. 2 charging and discharging a 10 pF capacitor at 100 MHz, for three different voltages, under nominal conditions. The maximum change in driver current scales roughly with voltage and is approximately independent of transitions up or down.

FIG. 8 shows simulated voltage waveforms of 42 ohm driver 200 at the driver output, into a 10 pF test load for the three output voltage ranges. The simulations were done with models based on a 0.25 micron effective gate length (Leff) CMOS technology under nominal conditions to determine the maximum block delays as shown in at the bottom FIG. 7. Note that the delays are roughly the same for transitions from a low to a high output voltage, or reverse. The delays are also roughly the same as VddQ, the I/O voltage, is varied from 3.3V to 1.5V. FIG. 9 shows the current into the 10 pF load under the same conditions. There is an approximate linear decrease in both peak current and current ramp, Di/Dt, with decrease in VddQ. This is desirable for control of simultaneous switching effects when many drivers are used on the same chip.

Figure 10:
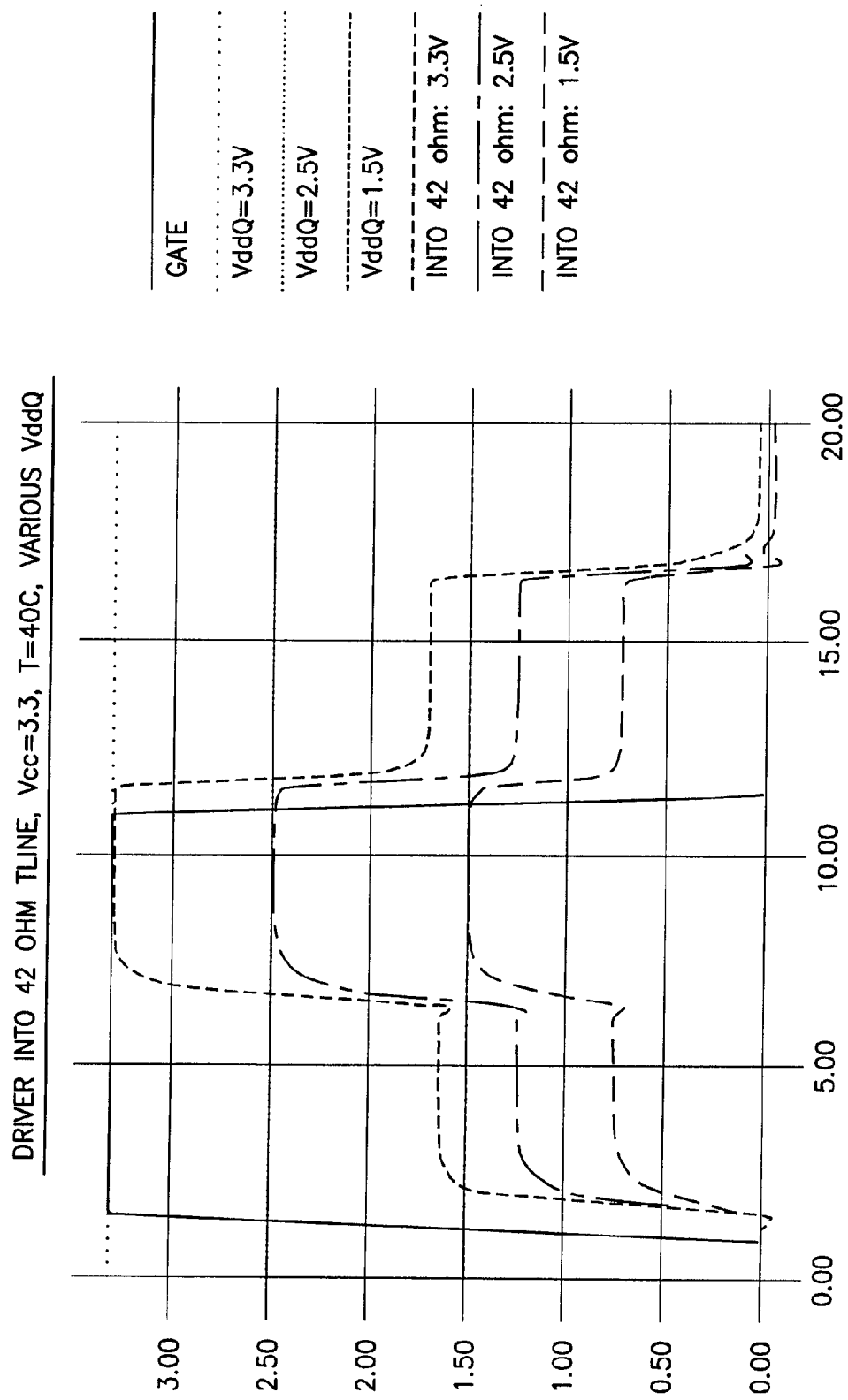
FIG. 10 shows a simulated voltage waveform of the driver of FIG. 2 charging and discharging a 42 ohm transmission line at 100 MHz, for three different voltages, under nominal conditions. The driver impedance is constant and equal to 42 ohms.

FIG. 10 shows simulated voltage waveforms of 42 ohm driver 200 at the driver output, into a 42 ohm transmission line for nominal conditions using the same CMOS technology as described above. These waveforms show that under nominal conditions, the driver output impedance is approximately 42 ohms at all output voltage levels.

We now turn to the discussion of the variable voltage receiver. FIG. 11 shows the detailed schematic of a CMOS receiver that can accept input signals of either 1.8V, 2.5V, or 3.3V LVCMOS levels, or signal voltage levels corresponding to JEDEC interface standards for HSTL, GTL, SSTL-3 or SSTL-2.5. The receiver front-end is a non-inverting design consisting of 2 CMOS inverter stages (1140 and 1150), combined with a differential input stage (1110) which may be bypassed using a pass gate (1120). The receiver front-end is optionally followed by a multiplexer (1160) for boundary scan test which is shown in detail in FIG. 12.

All inverter stages are connected between ground and the internal voltage rail Vdd of the CMOS chip. The final stage of the receiver, which is part of the mux (see FIG. 12), is a large CMOS inverter capable of driving approximately 1 pF load capacitance.

Figure 13:
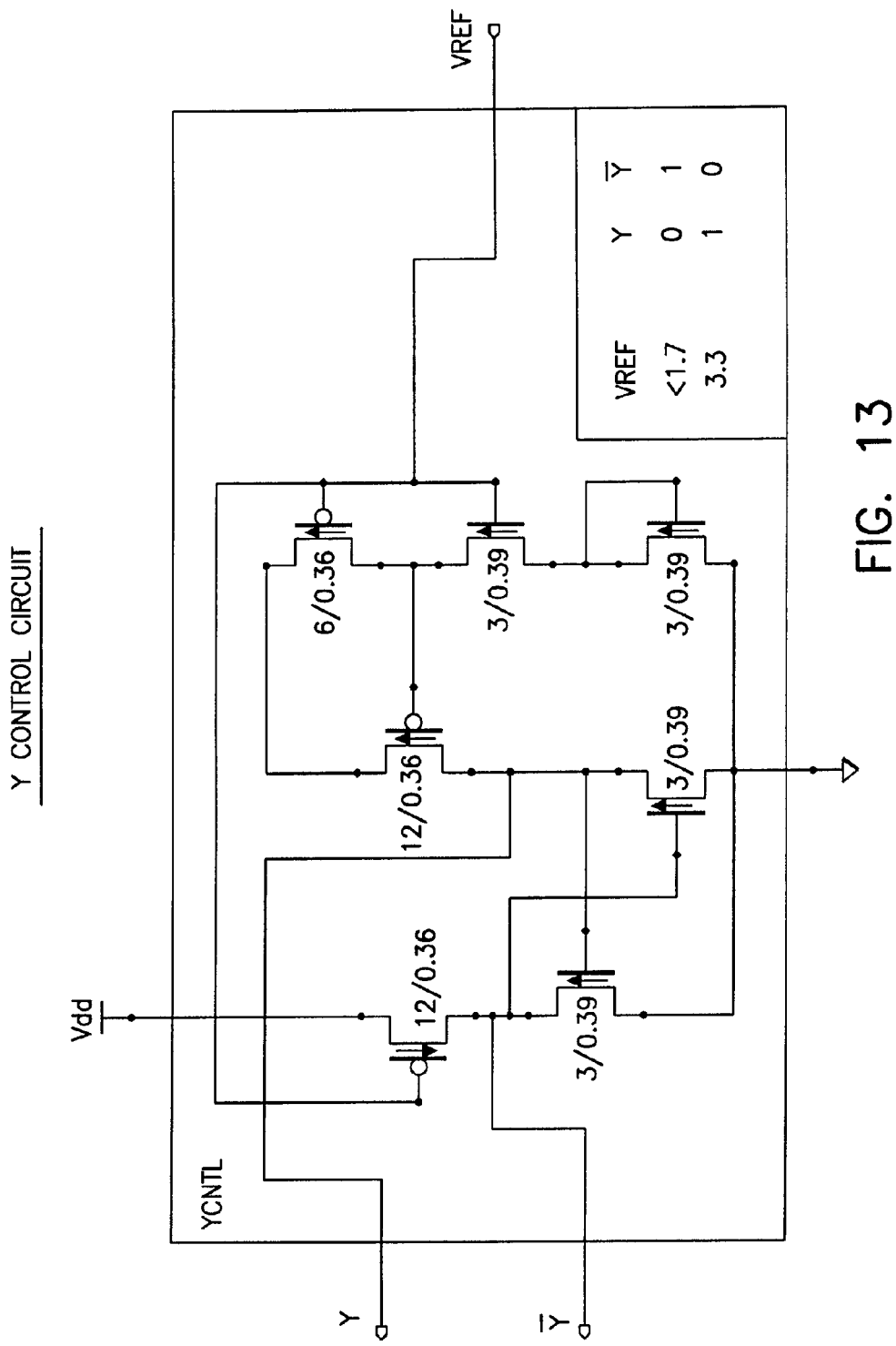
FIG. 13 shows a simple circuit that can be used to internally generate signals Y and Y_for the receiver of FIG. 11, from Vref and Vdd.
Figure 14:
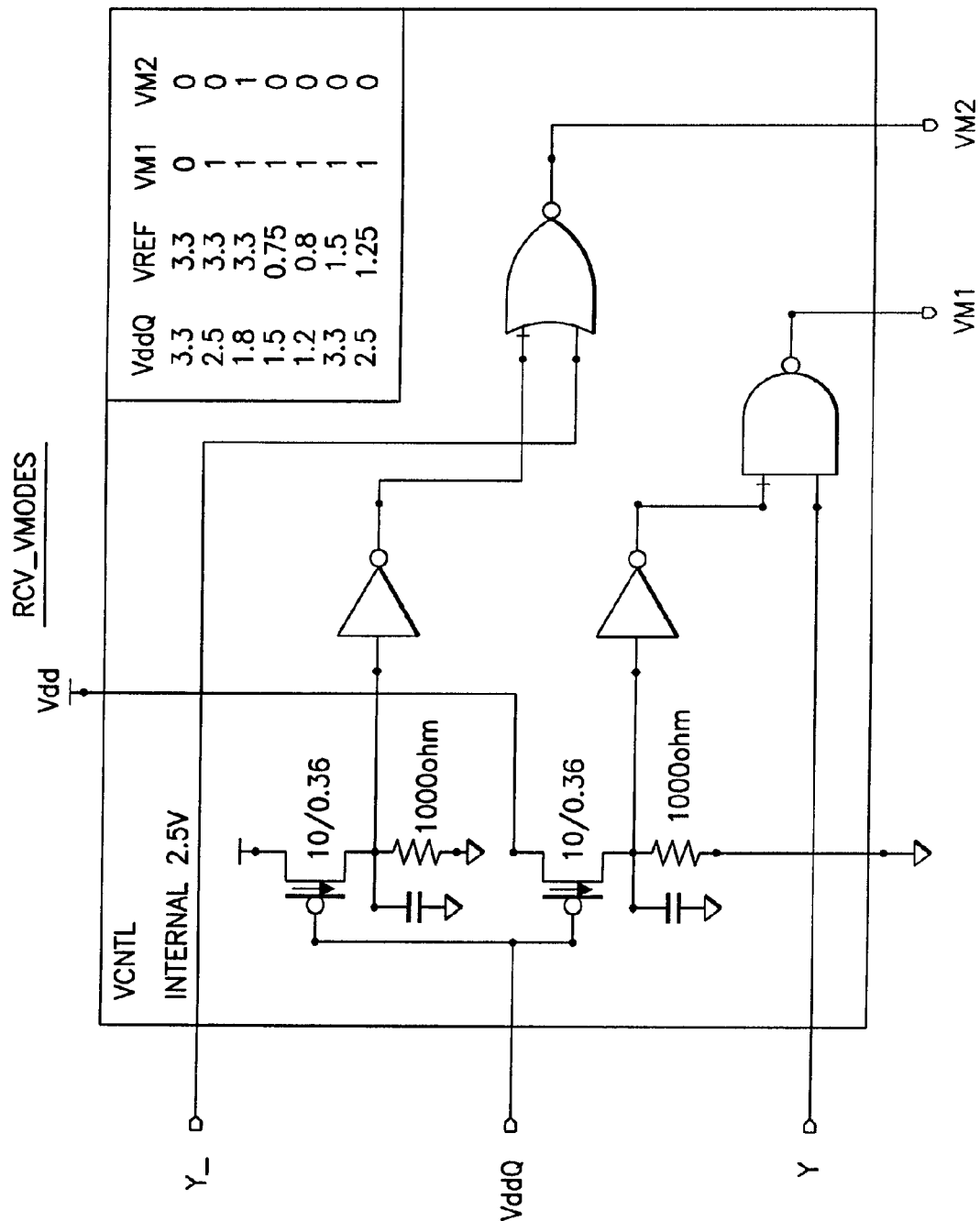
FIG. 14 shows a simple circuit that can be used to internally generate the VM1 and VM2 signals of FIG. 1, for 1.8V, 2.5V, or 3.3V operation for the receiver of FIG. 11, from Vdd, VddQ, and the Y and Y_signals of FIG. 13.

When used in LVCMOS modes (3.3V, 2.5V or 1.8V input signal levels) the input to the receiver, 1101, is connected to the gate of the first stage inverter, 1141 through the pass gate 1120. To select LVCMOS operation, the reference signal, Vref (1181), is connected to the CMOS internal voltage rail, 3.3V. This simultaneously disables the differential input stage, 1110, and activates the pass gate, 1120 via the signals Y (1182), and Y_(1183) which are generated by the control circuitry, 1180 which is shown in detail in FIG. 13. When Vref=Vdd, the signal Y (1182) is high, and its complement Y_(1183) is low. Y is connected to the gate of nFET 1122, and Y_is connected to the gate of pFET 1121 thus turning on the pass gate 1120. Also, Y_(1183) is connected to the gate of nFET 1131 so that when low, it turns off the current through pFET 1132 which disables the differential stage, 1110. The input inverter stage, 1140, has a variable threshold. The threshold is varied as follows. Referring to the control block 1170, shown in detail FIG. 14, which generates two control lines, VM1 (1172) and VM2 (1173), that are used to change the first stage inverter 1140 threshold according to truth table 1174. When control line VM1 is high (3.3 Volts) and control line VM2 is low (0 Volts), the receiver is in 2.5 volt mode. In this case the inverter 1140 should switch states at approximately 1.25V, or VddQ/2, under nominal conditions. This is accomplished by turning both pFET 1144 and nFET 1147 on, so that the inverter 1140 contains both the 3.2 micron wide, 0.36 micron long pFET 1142 and the pFET stack 1144 and 1145, effectively 3.2 micron wide and 0.36 micron long, in parallel. The result is an effective pFET pullup device of 6.4 micron width and 0.36 micron length. Similarly nFET 1143 is in parallel with nFET stack 1146 and 1147, and the effective size of the nFET pulldown device is 8.0 micron wide and 0.39 micron long. The first stage inverter 1140, thus configured, has a switch point between 1.17V and 1.22V under varying conditions of process, temperature and supply voltage, which is acceptable.

When control line VM1 is high and control line VM2 is high, the receiver is in 1.8 volt mode. In this case the inverter 1140 should switch states at roughly 1.0V, or just over VddQ/2, under nominal conditions. We put the threshold just over Vdd/2 to get increased immunity from ground bounce at low signal swings. This is accomplished by turning pFET 1144 off, but leaving nFET 1147 on, so that the inverter 1140 contains for a pullup device just the pFET 1142. As explained above nFET 1143 is in parallel with nFET stack 1146 and 1147, and the effective size of the nFET pulldown device of inverter 1140 remains 8.0 micron wide and 0.39 micron long. The first stage inverter 1140, thus configured, has a switch point of 1.0V under nominal conditions, and varies from 0.93V to 1.04V with changes in process, temperature and supply voltage, which is acceptable.

When control line VM1 is low and control line VM2 is low, the receiver is in 3.3 volt mode. In this case the inverter 1140 should switch states at roughly 1.5V, or just under VddQ/2, to comply with standard practice in receiving 3.3V CMOS signals. This is accomplished by turning pFET 1144 on, and turning nFET 1147 off, so that the inverter 1140 contains for a pullup device the three pFETs 1141, 1144, and 1145, but the pulldown device is just the nFET 1143. The first stage inverter 1140, thus configured, has a switch point of 1.52V under nominal conditions, and is stable to within 60 mV for both slow and fast conditions, which is acceptable.

Inverter 1150, the second stage of the receiver, is somewhat larger than inverter 1140, and is used to reduce the circuit delay of the receiver and to center the threshold at roughly 1.5V. It has an 10.0 micron wide, 0.36 micron long pFET pullup and a 5.0 micron wide, 0.39 micron long nFET pulldown. The gates of these devices are connected to the output of inverter 1140, and the output of the inverter 1150 in turn drives the boundary-scan mux, 1160.

As an alternative to LVCMOS levels, there are several JEDEC interface standards which use an externally supplied reference voltage, Vref (1181), to set the receiver switch point. As summarized in Table 1, these include HSTL (Vref=0.68-0.90V, 0.75V nominal), GTL (Vref=0.74-0.88V, 0.8V nominal), SSTL-3 (Vref=1.30-1.70V, 1.50V nominal), and SSTL-2.5 (Vref=1.25V nominal). When receiving these signals, the differential input stage, 1110, is active, and the pass gate, 1120, is disabled. for Vref<1.7V, the control circuitry 1180 sets the control signal Y (1182) low, and its complement Y_(1183) high. Y is connected to the gate of nFET 1122, and Y_is connected to the gate of pFET 1121 thus turning off the pass gate 1120. Also, Y_(1183) is connected to the gate of nFET 1131 so that when high, it turns on the current through pFET 1132 which enables the differential stage, 1110. The output from the differential stage, 1115, is connected to the variable threshold CMOS inverter, 1140, which is set in the 2.5V LVCMOS mode with switch point at around 1.25V by control signals VM1 and VM2 as described above. The differential input is made up of two branches consisting of transistors 1111 and 1112 in the signal branch, and transistors 1113 and 1114 in the reference branch. A current source, 1130, made up of transistors 1131, 1132, and 1133 drives a current of about 1 mA into the differential circuit. If Vin>Vref, more current is carried through devices in the reference branch, 1113 and 1114, which raises the voltage at node 1115. Conversely, if Vin<Vref, more current is carried through devices in the signal branch, 1111 and 1112, resulting in a decrease in the voltage at node 1115. Thus the differential stage 1110 is non-inverting. The voltage swing of the differential output, 1110, varies somewhat depending on the reference voltage, Vref. However, for the range of values encountered in the JEDEC standards (Vref=0.68V minimum for GTL, to 1.7V maximum for SSTL) in all cases, acceptable delay is obtained by setting the switch point of the first inverter stage, 1140, at 1.25V as described above.

Table 2 contains a summary of all information discussed above for the receiver of FIG. 11, including delay, standby current, and threshold for slow, fast, and nominal conditions. Note that the delay through the receiver is almost independent of the risetime of the input pulse, as the risetime is varied from 1 nanosecond to 6 nanoseconds. This is a very desirable property of a receiver. The delay through the receiver is also vary nearly independent of I/O voltage, showings its advantage in a variable voltage application.

The receiver leakage current, or current that runs from Vdd to ground through the receiver after a long period of inactivity at the input, is negligible in 3.3V mode, grows to roughly 150 microamps for 2.5V mode, and is as large as 320 microamps under fast conditions in 1.8 v mode. This is seen in the column under I (mA) in Table 2. The reason for this leakage at 1.8V is that the pullup device 1142 is not fully turned off by a positive input of 1.8V to the receiver. This problem can be corrected by the use of extra pullup devices on the input to shut off current through the device 1142, but also results in increased delay through the receiver. Alternatively the first stage of stages of the receiver can be connected to VddQ rather than Vdd, but this also results in increased delay for 1.8V mode. Our choice is a compromise between power and delay. This leakage current is substantially lower than the current required for operation of the differential input 1110, which for worst case fast conditions can be as large as 1.4 mA in HSTL mode.

In summary we present a method for communication between chips of different internal voltages. The method has the advantages of defaulting to common practice, i.e., communication at the internal voltage of the chip, when all chips have the same voltage. The method has the advantage of migrating the communication voltage to the voltage of the chip with the lowest internal voltage of all chips on a common bus, so that the chip with the lowest internal voltage, which is usually the fastest, costliest, and most sensitive chip, has just a single voltage for both internal and external operation. The method has the advantage of never requiring a chip to send or receive a voltage to another chip which is higher than its internal voltage. The method has the advantage that migration to an external voltage which is lower than the chip's internal voltage does not cause significant increased delay, or a significant change in driver impedance. The method has the advantage that the chip area required for this generality is only a small increase over that required for operation at the same internal and external voltage. The method has the advantage that a communication voltage lower than the lowest internal voltage of all the chips may also be used, for compliance with existing practice. The method has the advantage that a receiver may be used with either an external reference (differential comparator with VREF), or an internal reference (CMOS inverter), for compliance with existing practice. The method has the advantage that the driver circuit provides constant impedance for transitions up or down independent of the output voltage, without control circuits. The method has the advantage that the driver impedance may be readily changed, as described by earlier Ser. No. 08/598,084 by the same authors plus others. The method has the advantage that migration to a different voltage can be sensed internal to the chip, or can be programmed to the chip through external control lines.

While the invention has been shown and described with respect to particular embodiments thereof, it will be understood by those skilled in the art that changes in form and detail may be made without departing from the spirit and scope of the invention. In particular these structures hold for any voltage CMOS electronic device, including but not restricted to processors, controllers, and memory devices.

TABLE 1

I/O Interface Comparison

| Symbol | Parameter | | SSTL_3 Class I | SSTL_3 Class II | HSTL | CTT | GTL Unterminated | GTL Terminated | LVCMOS | LVTTL | Units | Notes |
|---|---|---|---|---|---|---|---|---|---|---|---|---|
| $V_{DD}$ | Device | Min | $V_{DDQ}$ | | — | — | — | | 2.7 | 3.0 | V | |
| | Supply | Nom | Any | | 3.3/2.X | 3.3/2.X | 5.0/3.3/2.X | | 3.0 | 3.0 | | |
| | Voltage | Max | — | | — | — | — | | 3.6 | 3.6 | | |
| $V_{DDQ}$ | Output | Min | 3.0 | | 1.4 | — | 1.14 | — | — | — | V | |
| | Supply | Nom | 3.3 | | 1.5 | $V_{DD}$ | 1.2 | — | — | — | | |
| | Voltage | Max | 3.6 | | 1.6 | — | 1.26 | — | — | — | | |
| $V_{REF}$ | Input | Min | 1.3 | | 0.68 | 1.35 | $(2/3)V_{DDQ} - 2\%$ | $(2/3)V_{TT} - 2\%$ | — | — | V | |
| | Reference | Nom | 1.5 | | 0.75 | 1.5 | 0.8 | 0.8 | — | — | | |
| | Voltage | Max | 1.7 | | 0.90 | — | $(2/3)V_{DDQ} + 2\%$ | $(2/3)V_{TT} + 2\%$ | — | — | | |
| $V_{TT}$ | Termination | Min | $V_{REF} - 0.05$ | | — | — | — | 1.14 | — | — | V | |
| | Voltage | Nom | $V_{REF}$ | | $V_{REF}$ | $V_{REF}$ | — | 1.2 | — | — | | |
| | | Max | $V_{REF} + 0.05$ | | — | — | — | 1.26 | — | — | | |
| $V_{IH}$ | DC Input | Min | $V_{REF} + 0.20$ | | $V_{REF} + 0.10$ | $V_{REF} + 0.2$ | $V_{REF} + 0.05$ | | 2.0 | 2.0 | V | |
| | Logic High | Max | $V_{DDQ} + 0.3$ | | $V_{DDQ} + 0.3$ | — | — | | $V_{DD} + 0.3$ | $V_{DD} + 0.3$ | | |
| $V_{IL}$ | DC Input | Min | −0.30 | | −0.30 | — | — | | −0.3 | −0.3 | V | |
| | Logic Low | Max | $V_{REF} - 0.20$ | | $V_{REF} - 0.10$ | $V_{REF} - 0.2$ | $V_{REF} - 0.05$ | | 0.8 | 0.8 | | |
| $V_{OH}$ | High Level Output | Min | $V_{TT} + 0.6$ | $V_{TT} + 0.8$ | $V_{DDQ} - 0.40$ | $V_{REF} + 0.4$ | $V_{DDQ} - 0.4$ | — | $V_{DD} - 0.2$ | 2.4 | V | |

TABLE 1-continued

I/O Interface Comparison

| Symbol | Parameter | SSTL_3 Class I | SSTL_3 Class II | HSTL | CTT | GTL Unterminated | GTL Terminated | LVCMOS | LVTTL | Units | Notes |
|---|---|---|---|---|---|---|---|---|---|---|---|
| $V_{OL}$ | Voltage Low Level Max Output Voltage | $V_{TT} - 0.6$ | $V_{TT} - 0.8$ | 0.40 | $V_{REF} - 0.4$ | 0.4 | 0.4 | 0.2 | 0.4 | V | |
| $I_{OH}$ | Output Min. Source DC Current | 8 | 16 | 8 or 16 | — | 4 | — | — | — | mA | 1 |
| $I_{OL}$ | Output Min. Sink DC Current | 8 | 16 | −8 to −48 | — | 4 | 40 | — | — | mA | 2 |

1. For HSTL $I_{OH}$ is 8 mA for Class I, Class III, and Class IV, or $I_{OH}$ is 16 mA for Class II.
2. For HSTL $I_{OH}$ is −8 mA for Class I, −16 mA for Class II, −24 mA for Class III, and −48 mA for Class IV.

TABLE 2

| | | 1 nS RISETIME | | | 6 nS RISETIME | | | | |
|---|---|---|---|---|---|---|---|---|---|
| | | DATA_IN to DATA_OUT (nS) | DATA_OUT to MUX_OUT (nS) | TOTAL (nS) | DATA_IN to DATA_OUT (nS) | DATA_OUT to MUX_OUT (nS) | TOTAL (nS) | I (mA) | I (mA) diff amp off/on |
| 3.3 V LVCMOS (Vt = 1.5 V) | F | .20/.20 | .24/.24 | .44/.44 | .30/.33 | .24/.25 | .54/.58 | 0 | 0 |
| | N | .33/.32 | .39/.39 | .72/.71 | .50/.48 | .40/.40 | .90/.87 | 0 | 0 |
| | S | .50/.48 | .60/.60 | 1.10/1.07 | .76/.67 | .61/.60 | 1.37/1.26 | 0 | 0 |
| 2.5 V LVCMOS (Vt = 1.25 V) | F | .14/.22 | .24/.24 | .38/.46 | .08/.48 | .24/.26 | .32/.74 | .07 | 0 |
| | N | .28/.30 | .40/.39 | .67/.69 | .39/.50 | .40/.40 | .79/.90 | .02 | 0 |
| | S | .44/.44 | .60/.59 | 1.05/1.04 | .69/.62 | .61/.60 | 1.30/1.22 | .01 | 0 |
| 1.8 V LVCMOS (Vt = 0.9 V) | F | .21/.24 | .24/.25 | .45/.48 | .33/.39 | .24/.26 | .58/.65 | .32 | 0 |
| | N | .39/.34 | .40/.40 | .79/.74 | .82/.33 | .40/.40 | 1.22/.73 | .15 | 0 |
| | S | .60/.53 | .60/.60 | 1.20/1.13 | 1.25/.43 | .60/.60 | 1.86/1.03 | .08 | 0 |
| 3.3 V SSTL (Vref = 1.5 V) | F | .21/.23 | .24/.24 | .45/.48 | .30/.35 | .24/.24 | .54/.59 | 0 | .40/1.67 |
| | N | .38/.41 | .39/.39 | .77/.80 | .51/.57 | .39/.39 | .91/.97 | 0 | .26/1.06 |
| | S | .64/.66 | .60/.60 | 1.24/1.25 | .80/.88 | .60/.60 | 1.40/1.48 | 0 | .17/.71 |
| 2.5 V SSTL (Vref = 1.25 V) | F | .22/.24 | .24/.24 | .46/.49 | .31/.37 | .24/.24 | .56/.61 | 0 | .76/1.70 |
| | N | .37/.41 | .39/.39 | .77/.81 | .54/.59 | .39/.39 | .93/.99 | 0 | .45/1.07 |
| | S | .59/.65 | .60/.60 | 1.20/1.25 | .82/.90 | .60/.59 | 1.43/1.50 | 0 | .32/.61 |
| HSTL (Vref = 0.75 V) | F | .23/.34 | .24/.25 | .47/.58 | .31/.54 | .24/.25 | .55/.79 | .13 | 1.59/1.75 |
| | N | .39/.50 | .40/.39 | .79/.89 | .60/.71 | .40/.40 | .99/1.11 | .03 | 1.01/1.09 |
| | S | .61/.75 | .60/.60 | 1.21/1.35 | .92/1.02 | .60/.60 | 1.52/1.62 | .01 | .68/.72 |
| GTL (Vref = 0.8 V) | F | .26/.36 | .24/.25 | .51/.61 | .33/.61 | .24/.25 | .57/.86 | .25 | 1.65/1.74 |
| | N | .46/.54 | .40/.39 | .86/.93 | .70/.83 | .40/.40 | 1.09/1.23 | .07 | 1.05/1.08 |
| | S | .72/.81 | .60/.60 | 1.32/1.41 | 1.10/1.21 | .60/.60 | 1.70/1.81 | .03 | .70/.72 |

First number in each delay column is for L/H transition, second number is for H/L transition.
F, N, S are:
fast (10 C, V + 5%, 3 sigma fast process),
nominal (50 C, V, nominal process), and
slow (90 C, V − 5%, 3 sigma slow process) conditions
VDDQ (Vin) 3.3 V/2.5 V/1.8 V/1.5 V/1.2 V; VDD 3.3 V

We claim:
1. A structure comprising:
a plurality of electronic devices with the same or different internal voltages;
an interconnection between two or more of said electronic devices;
driver and receiver circuits which provide selectable input/output voltage levels for interfacing with other electronic devices, thus allowing said other electronic devices to communicate using a signal voltage range most suitable for each of said other electronic devices;
circuitry for electing or adjusting a type of receiver circuit used, thus allowing either the use of a differential comparator circuit with an externally supplied reference voltage, or alternatively, the use of an inverter style receiver with an adjustable threshold.

2. A structure comprising:
a plurality of electronic devices with the same or different internal voltages;
an interconnection between two or more of the electronic devices;
driver and receiver circuits which provide selectable input/output voltage levels for interfacing with other electronic devices, thus allowing said other electronic devices to communicate using a signal voltage range most suitable for each of said other electronic devices;
circuitry for selecting or adjusting a type of receiver circuit used, thus allowing either the use of a differential comparator circuit with an externally supplied reference voltage, or, alternatively, the use of an inverter style receiver with an adjustable threshold, the selection being accomplished by setting the external reference to a predetermined voltage.

3. A structure comprising:
- a plurality of electronic devices with the same or different internal CMOS voltages;
- an interconnection between two or more of the electronic devices;
- driver and receiver circuits which provide selectable input/output voltage levels for interfacing with several generations of CMOS technology, thus allowing chips fabricated in such technologies to communicate using a signal voltage range most suitable for each chip;
- circuitry for selecting or adjusting the type of receiver circuit used, thus allowing either the use of a differential comparator circuit with an externally supplied reference voltage, or alternatively, the use of an inverter style receiver with an adjustable threshold, the selection being accomplished by setting the external reference to a predetermined voltage;
- circuitry for selecting or adjusting the switching threshold of the inverter receiver circuit, which enables the threshold to be set appropriately for a given input signal voltage range.

* * * * *